United States Patent
Howell et al.

(10) Patent No.: US 6,261,853 B1
(45) Date of Patent: Jul. 17, 2001

(54) METHOD AND APPARATUS FOR PREPARING SEMICONDUCTOR WAFERS FOR MEASUREMENT

(75) Inventors: Michial Duff Howell, Felton; Barry Roy Bowman, Dublin, both of CA (US)

(73) Assignee: Therma-Wave, Inc., Fremont, CA (US)

( * ) Notice: Subject to any disclaimer, the term of this patent is extended or adjusted under 35 U.S.C. 154(b) by 0 days.

(21) Appl. No.: 09/499,478

(22) Filed: Feb. 7, 2000

(51) Int. Cl.[7] .................................................. H01L 21/66
(52) U.S. Cl. ............................ 438/14; 438/16; 356/484; 356/496
(58) Field of Search ......................... 438/14, 16; 356/484

(56) References Cited

U.S. PATENT DOCUMENTS

| | | | |
|---|---|---|---|
| 3,887,392 | 6/1975 | Tang | 134/1 |
| 5,049,816 | * 9/1991 | Moslehi | 324/158 |
| 5,261,965 | * 11/1993 | Moslehi | 134/1 |
| 5,306,671 | 4/1994 | Ogawa et al. | 437/225 |
| 5,439,596 | 8/1995 | Ohmi et al. | 210/748 |
| 5,449,411 | 9/1995 | Fukuda et al. | 118/723 MP |
| 5,798,837 | 8/1998 | Aspnes et al. | 356/369 |

FOREIGN PATENT DOCUMENTS

| | | | |
|---|---|---|---|
| 4-357836 | 6/1991 | (JP) | H01L/21/304 |
| 10-137704 | 11/1996 | (JP) | B08B/3/12 |
| WO 95/00681 | 1/1995 | (WO) | C23G/1/00 |
| WO 99/02970 | 1/1999 | (WO) | G01N/21/21 |
| WO 99/356677 | * 7/1999 | (WO) | H01L/21/306 |

OTHER PUBLICATIONS

A Novel Pretreatment For Thin–film Measurements Adrien Danel, Francois Tardif, Emil Kamieniecki Soild State Technology, Sept. 1999, pp. S3–S6.

* cited by examiner

Primary Examiner—John F. Niebling
Assistant Examiner—Olivia Luk
(74) Attorney, Agent, or Firm—Stallman & Pollock LLP

(57) ABSTRACT

A wafer-cleaning module is disclosed for removing contaminants from a semiconductor wafer prior to measurement in a metrology tool. The cleaning module includes a heating chamber including a heater plate for heating the wafer by conduction. A separate cooling chamber is provided to cool the wafer. The system is controlled by a processor so the heating cycle, cooling cycle and the time periods between these cycles and the measurement cycle are uniform for all wafers.

11 Claims, 8 Drawing Sheets

METHOD AND APPARATUS FOR PREPARING SEMICONDUCTOR WAFERS FOR MEASUREMENT

TECHNICAL FIELD

This application relates to optical inspection equipment used to evaluate parameters of thin films on semiconductor wafers. The subject invention includes a cleaning module for reducing contaminants on the surface of the wafer prior to measurement to improve the accuracy and repeatability of the optical measurements. In the preferred embodiment, the cleaning module includes separate heating and cooling chambers for processing the wafer prior to measurement in the metrology tool.

BACKGROUND OF THE INVENTION

For many years, devices have existed for evaluating parameters of a semiconductor wafer at various stages during fabrication. There is a strong need in the industry to evaluate the parameters of multiple-layer thin film stacks on wafers using non-contact optical metrology tools. In these devices, a probe beam of radiation is directed to reflect off the sample and changes in the reflected probe beam are monitored to evaluate the sample.

One class of prior measurement devices relied on optical interference effects created between the layers on the sample or the layer and the substrate. In these devices, changes in intensity of the reflected probe beam caused by these interference effects are monitored to evaluate the sample. In many applications, the probe beam is generated by a broad band light source and such devices are generally known as spectrophotometers.

In another class of instruments, the change in polarization state of the reflected probe beam is monitored. These devices are known as ellipsometers.

As thin films and thin film stacks have become more numerous and complex, the industry has begun developing composite measurement tools that have multiple measurement modules within a single device. One such tool is offered by the assignee herein under the name Opti-Probe 5240. This device includes a number of measurement modules including a broad band spectrophotometer and a single wavelength, off-axis ellipsometer. The device also includes a broadband rotating compensator ellipsometer as well as a pair of simultaneous multiple angle of incidence measurement modules. The overall structure of this device is described in PCT WO 99/02970, published Jan. 21, 1999, incorporated herein by reference. The Opti-Probe device is capable of deriving information about ultra-thin films and thin film stacks with a high degree of precision.

There is a trend in the semiconductor industry to utilize very thin layers. For example, today, gate dielectrics can have a thickness less than 20 Å. It is anticipated that even thinner layers will be used. There is a need to measure the thickness of these very thin layers with a precision and repeatability to better than 0.1 Å. While the Opti-Probe device is capable of making such measurements with the necessary precision, problems have arisen with respect to repeatability, especially with ultra thin films. Repeatability means that if the same measurement is made at two different times, the same result for layer thickness will be produced.

After considerable investigation, it has been determined that variations in measurements over time are strongly affected by atmospheric conditions such as temperature, humidity and exposure time to the air. For example, the measured layer thickness could be considerably higher when the humidity is relatively high. In addition, the thickness of the layer can be effected by the growth of a contaminant layer, even in so called "clean room" environments. In fact, it is known that a clean room can contain a wide variety of contaminants including plastics, lubricants, solvents, etc. The variation in measurement due solely to atmospheric conditions can be on the order of 0.1 Å which substantially reduces the likelihood of making repeatable measurements with a precision of 0.1 Å. In order to improve the repeatability of the measurements results, it would be desirable to remove the contaminant layer prior to measurement.

There are many types of wafer cleaning procedures used in a semiconductor fabrication facility. However, any cleaning procedures which require contact with the wafer, such as cleaning solutions, would not be desirable at this stage of fabrication since it can damage or contaminate the gate dielectric or the wafer. Additionally, most chemical cleaning processes require a drying cycle during which time a new hydrocarbon contamination layer could reform.

One suitable type of wafer cleaning system is described in our copending application Ser. No. 09/294,869, filed Apr. 20, 1999, and incorporated herein by reference. One embodiment of the system described in the latter patent application includes a microwave generator for exciting water molecules in order to drive off contaminants. Another approach described in the latter application was the use of a radiant heating source to drive off contaminants. Various additional combinations including microwave and radiant excitation along with UV radiation or a stream of frozen carbon dioxide pellets were suggested.

Another wafer cleaning system is described in PCT Application Ser. No. WO 99/35677 published Jul. 15, 1999. The device disclosed in this application relies primarily on radiant heating using tungsten halogen quartz lamps. An important aspect of the device in the latter application is the presence of high-energy light wavelengths for breaking bonds in the contaminant layer. The wafer cleaner described in this PCT application has a single chamber. Cooling can be achieved through the use of a water-cooled bottom reflector in the chamber.

After considerable experimentation, it has been determined that the principal mechanism for removing contaminants in the approaches described above relates directly to an increase in the temperature of the wafer. Although microwave excitation and radiant light exposure both function to increase the temperature of the wafer, the latter two approaches are not the most efficient method of raising the temperature of the wafer. Therefore, it is believed that the best approach for preparing a wafer for measurement is to heat the wafer directly, by conduction.

Direct conductive heating has many advantages. For example, direct conductive heating can raise the temperature of the wafer to the desired temperature much faster than with either microwave or radiant energy exposure given the same amount of input energy. In addition, direct conductive heating can produce a more uniform and repeatable temperature rise in the wafer without complex equipment design.

Further experimentation also revealed that optimal results can only be achieved if the process is carefully controlled. Careful control includes heating each wafer to the same temperature, subjecting each wafer to the same cooling cycle and insuring that the time between the end of the cooling cycle and the beginning of the measurement cycle in the metrology tool is the same for all wafers.

Accordingly it is an object of the subject invention to provide an improved wafer-cleaning module which can accurately and repeatably remove contaminants from a wafer prior to measurement in a metrology tool.

SUMMARY OF THE INVENTION

A wafer-cleaning module is disclosed which includes a heating station having a planar heater element for heating the wafer by conduction. In the preferred embodiment, the heater element is a plate formed from a dielectric material such as alumina. The plate has a thin layer of a resistive material attached or deposited on the underside thereof. An electrical current applied to the resistive layer creates heat which diffuses evenly through the plate. A set of lift pins can be provided to raise and lower the wafer onto the plate. The lift pins are provided to permit a robotic arm to more easily load and remove the wafer from the heating station.

The wafer-cleaning module further includes a separate, thermally isolated cooling station. The cooling station includes a planar heat sink surface which can be air or water-cooled. Having separate heating and cooling stations allows the wafer to be cooled faster and more efficiently than if the cooling is performed within the heating station.

In accordance with the subject invention, the cleaning module is placed under the control of a processor. In order to achieve repeatability of the measurement of the wafer, the heating and cooling steps must be the same for each of the wafers being tested. To the extent possible, each wafer should be heated to roughly the same temperature and held at that temperature for roughly the same period of time. Each wafer should be subjected to the same cooling cycle. In addition, the time period between the end of the cooling cycle and the initiation of the measurement cycle should also be the same for each wafer.

In the preferred embodiment, a robotic arm loads the wafer into the heating station (chamber). The processor controls the heating chamber based on both time and feedback from temperature sensors in the chamber. When the heating cycle is complete, the robotic arm will transfer of the wafer from the heating chamber to the cooling station (chamber). After the cooling cycle is complete, the robotic arm will transfer the wafer to the metrology tool for measurement. As noted above, each of the various cycles and periods between cycles should be the same for each wafer.

Further objects and advantages of the subject invention will become apparent from the following detailed description taken in conjunction with the drawings in which:

DETAILED DESCRIPTION OF THE PREFERRED EMBODIMENT

Figure 1:
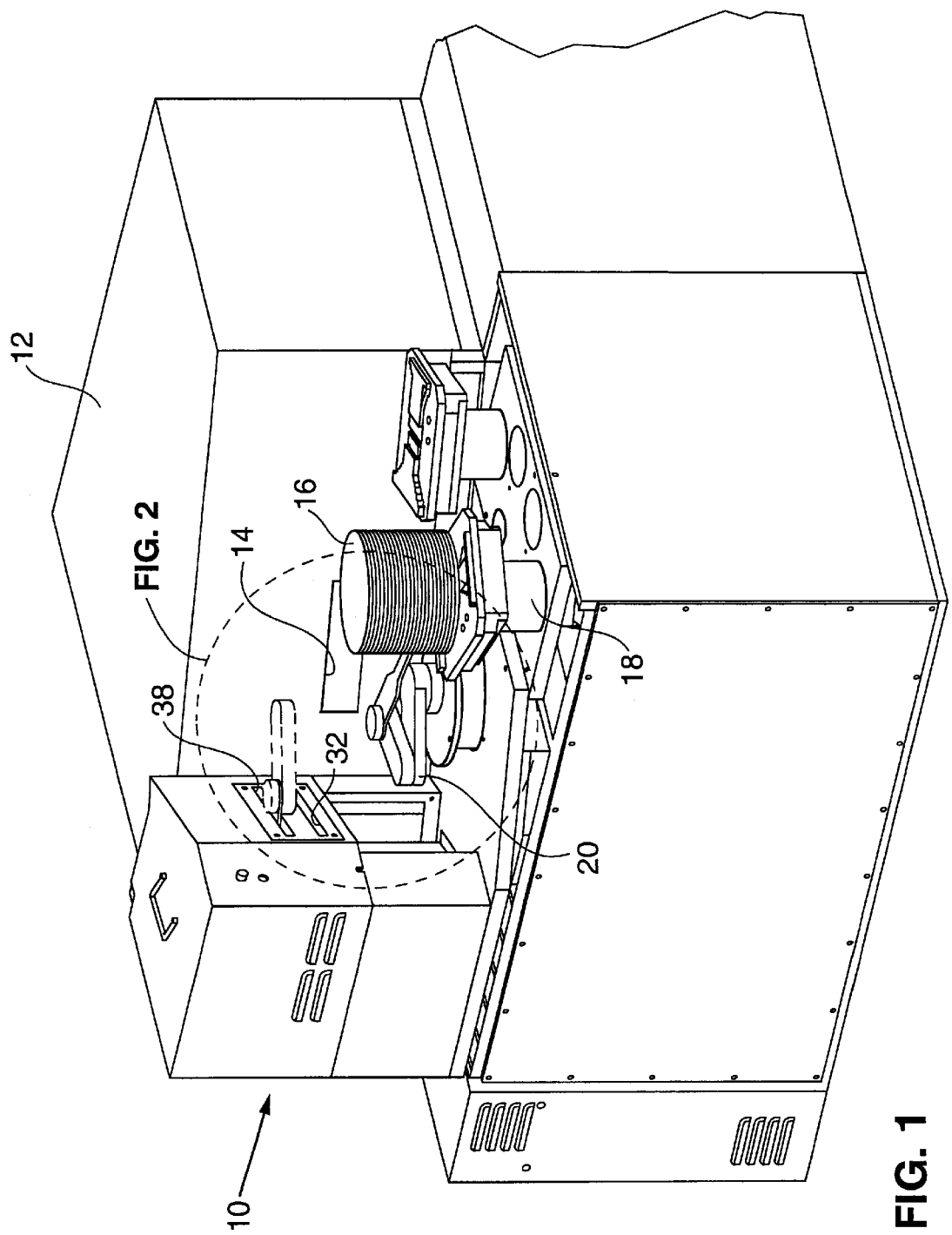
FIG. 1 is a perspective you illustrating the cleaning module of the subject invention mounted in conjunction with a metrology tool.

FIG. 1 is a perspective view of the cleaning module 10 shown integrated with a metrology tool 12. The metrology tool 12 includes one or more measurement modules of the type described in PCT WO 99/02970 and marketed by the assignee under the name Opti-Probe 5240. The metrology tool includes an opening 14 for receiving wafers 16 are held in a cassette (not shown) loaded on a cassette station 18 prior to being placed into the heating module 10. A processor controlled robotic arm 20 is provided for taking wafers from the cassette and inserting them into the cleaning module 10 and thereafter into the metrology tool 12.

Figure 2:
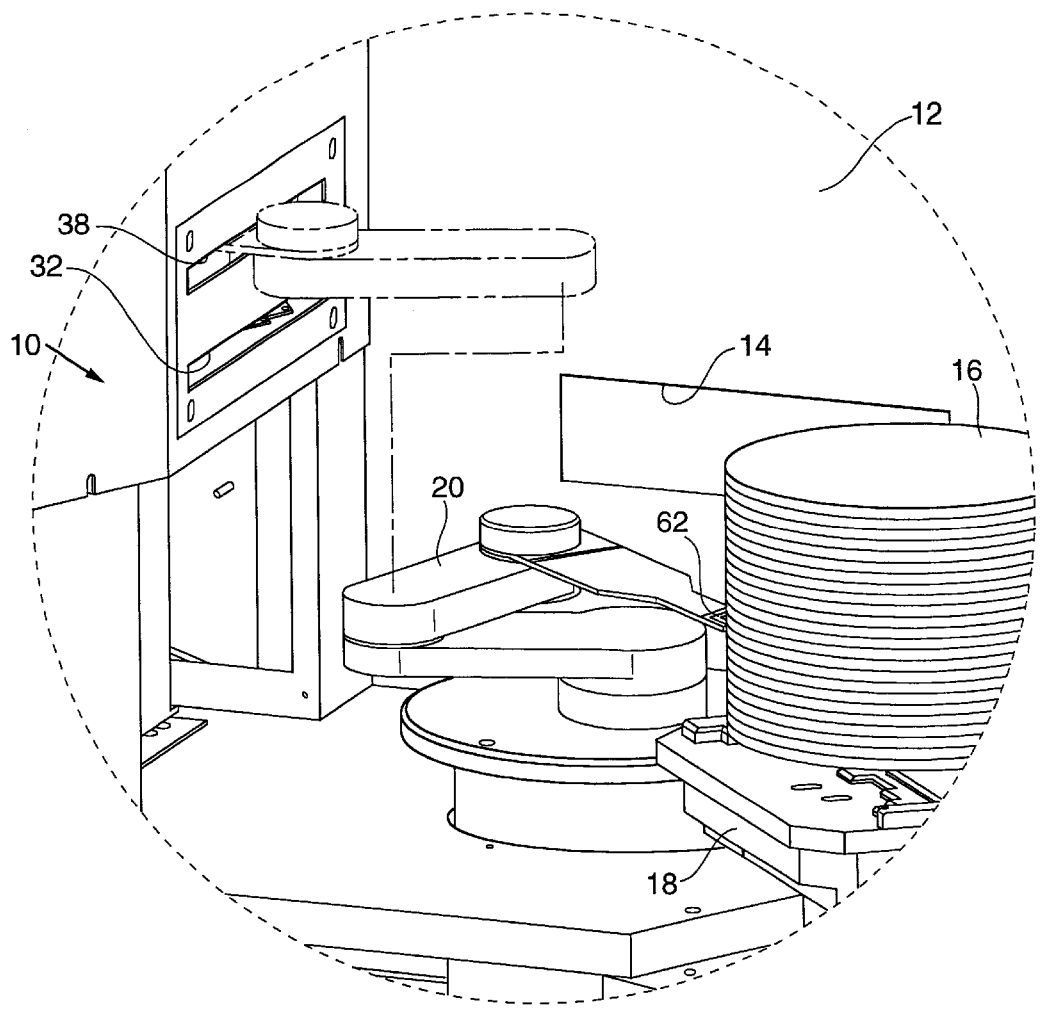
FIG. 2 is an enlarged view of the wafer-handling portion of the cleaning module of the subject invention.

In FIGS. 1 and 2, the robotic arm 20 shown in solid lines is oriented towards the wafer stack. The free end of the arm is also shown in phantom line in these figures and illustrates the insertion of a wafer into the cleaning module.

Figure 3:
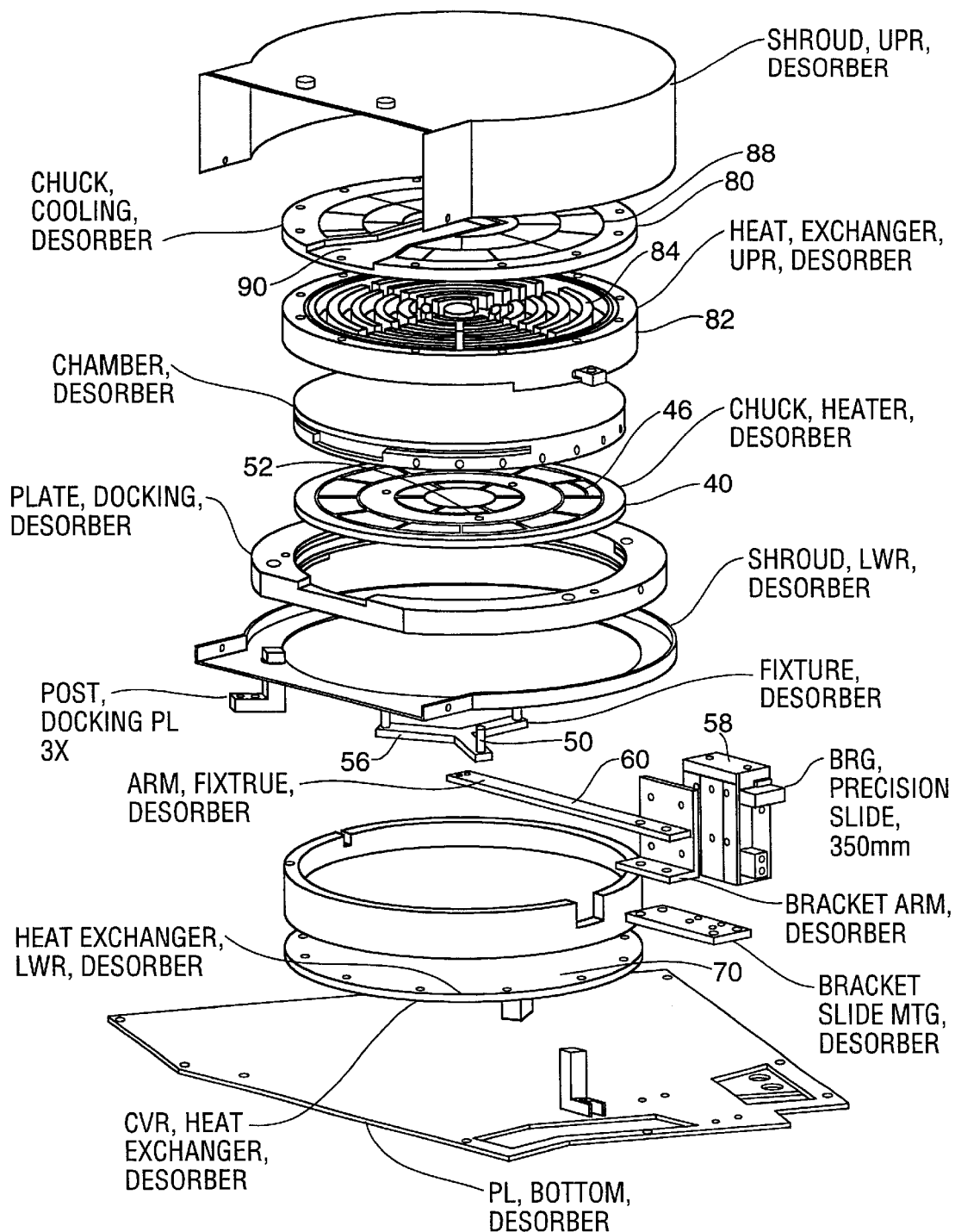
FIG. 3 is that exploded perspective view of the cleaning module of the subject invention.
Figure 4:
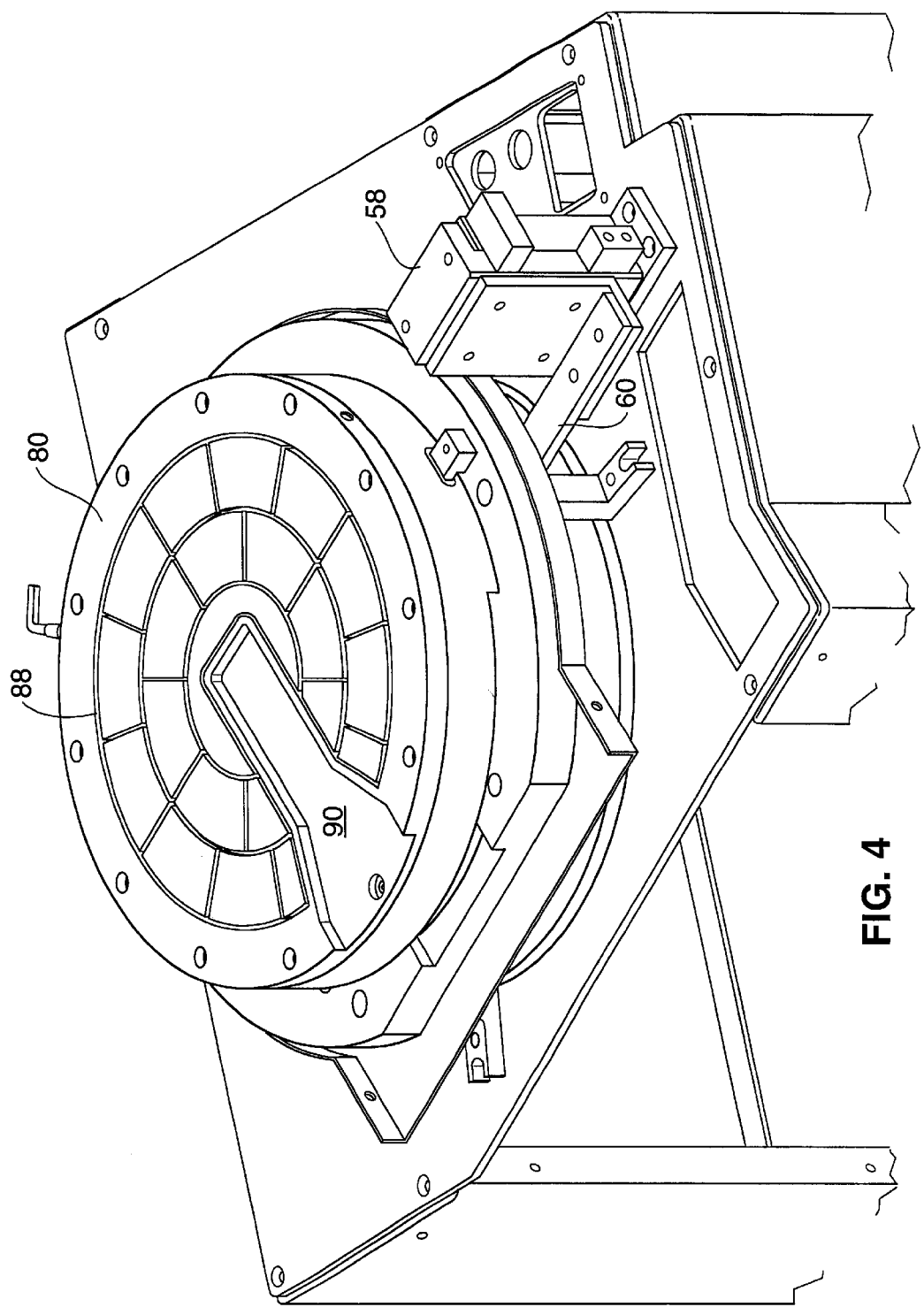
FIG. 4 is a perspective view of the cleaning module of the subject invention with the shroud removed.
Figure 5:
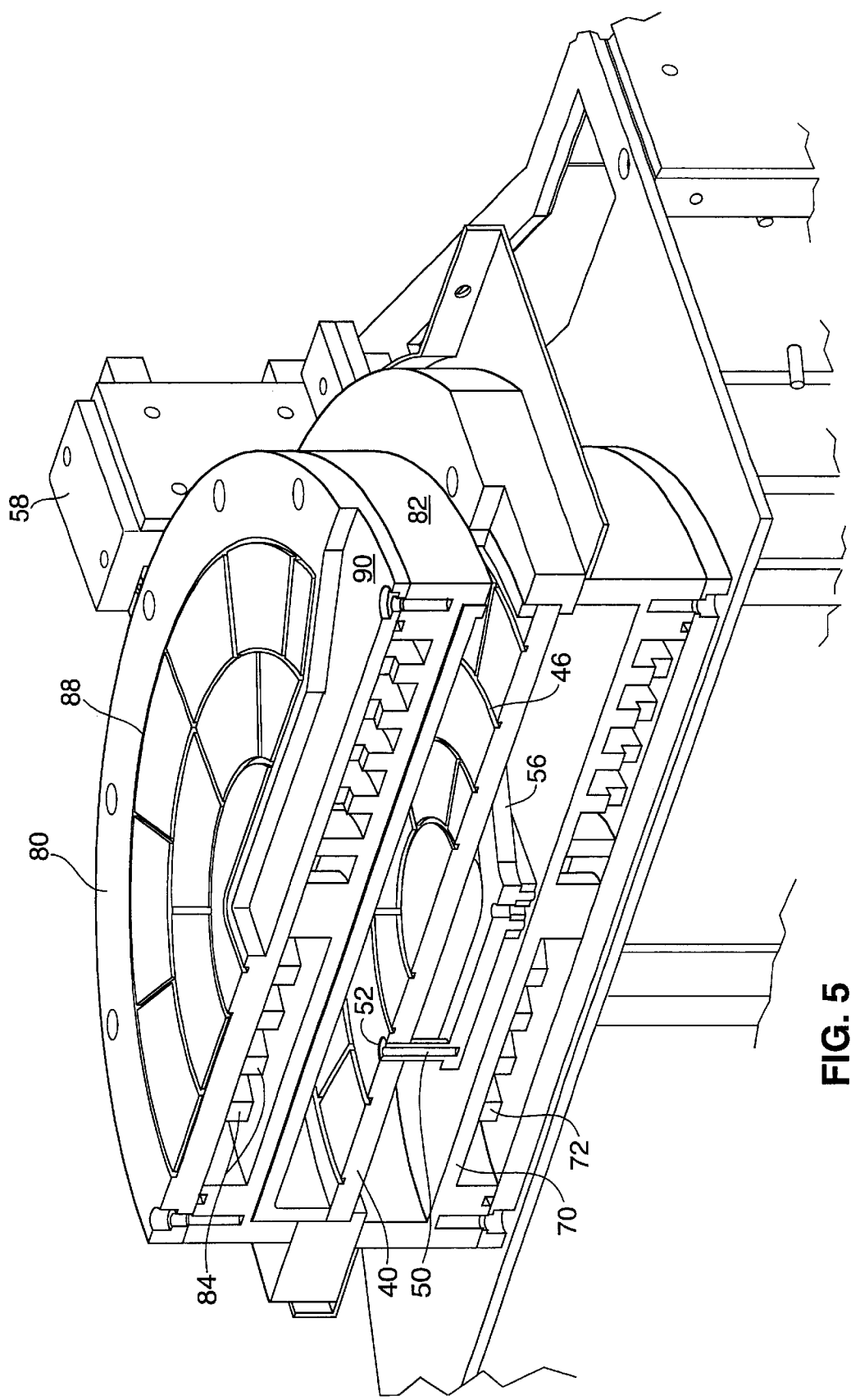
In FIG. 5 is a perspective view, partially in section, of the cleaning module of FIG. 4.

Cleaning module 10 includes a lower heating chamber 30 having an entrance slot 32 and an upper cooling chamber 36 with an entrance slot 38. Alternatively, the heating chamber could be located above the cooling chamber. FIGS. 3, 4 and 5 provide a more detailed view of the internal elements of the cleaning module 10. As seen therein, the heating station 30 includes a planar heater element 40. In the preferred embodiment, the heater element or plate 40 is formed from a dielectric material such as alumina. A resistive material is connected to the bottom surface of the plate 40. In the preferred embodiment, the resistive material is deposited on the lower surface of the plate. The deposited layer is thin, compact and can rapidly achieve a high-temperature when electric current is supplied thereto. Preferably, the diameter of the heater element is larger than the diameter of the wafer 16.

The upper surface of heater element 40 includes a pattern of grooves 46. The grooves 46 are connectable to a source of vacuum via a hole (not shown) drilled from the bottom side of the plate up to and into communication with the groove 46. Application of a vacuum to the groove draws the wafer into close physical contact with the plate 40 to maximize heat transfer and control uniformity of the heating.

Figure 6:
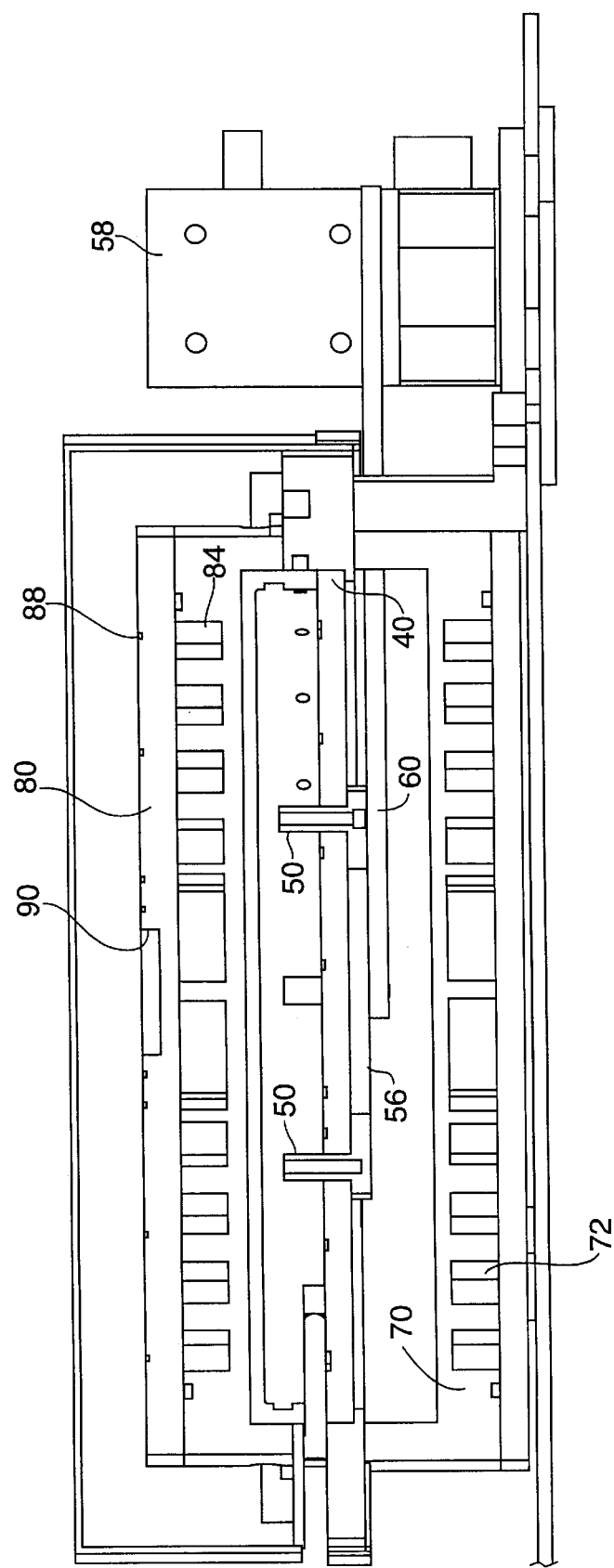
FIG. 6 is a cross-sectional view of the cleaning module showing the lift pins in the heating station in the raised position.

To facilitate the loading and unloading of a wafer into the heating chamber, a plurality of movable lift pins 50 are provided. As seen in FIGS. 5 and 6, lift pins 50 are slidable within channels 52 provided in plate 40. When a wafer is being loaded into the heating chamber, the lift pins 50 are positioned in the upper orientation. In this position, the robotic arm 20 can load the wafer into the heating chamber through slot 32 and lower the wafer onto the top of pins 50 (See FIG. 6). Once the wafer is in place, the robotic arm can be lowered and withdrawn from the heating chamber. At this point, pins 50 are lowered so that the wafer is in contact with the plate 40 (See FIG. 7). The pins are carried on a fixture 56 which is connected to a lift mechanism 58 via an extended arm 60.

It has been found desirable to run the vacuum system as the wafer is being lowered onto the plate by the pins. By this approach, the wafer will be firmly grabbed by the plate and will not slide around on a thin layer of air that could otherwise be compressed under the wafer as it drops onto the planar surface of the plate. To facilitate handling, the free end 62 (FIG. 2) of the robotic arm has a vacuum port for drawing the wafer into tight contact with the arm while the wafer is being moved between stations.

Heating station 30 is provided with a purge gas system. A gas inlet and gas outlet (not shown) are provided on opposite sides of the chamber. The purge gas is preferably an inert species such as nitrogen. Circulation of the purge gas can facilitate removal of the contaminants which have been freed from the surface of the wafer during heating. Various temperature sensors can also be provided to permit automatic monitoring of the cleaning process.

The heating chamber is preferably water cooled to limit the amount of heat which can escape from the heating chamber into the environment. As best seen in FIG. 5, a heat exchanger 70 is located in the bottom portion of the heating chamber. The bottom surface of heat exchanger includes a plurality of fins 72 through which a cooling fluid is passed.

The upper portion of the cleaning module 10 includes a cooling chamber 36. Mounted within cooling chamber 36 is a metal plate 80. Metal plate 80 is in thermal contact with a heat exchanger 82. Heat exchanger 82 has a plurality of fins 84 through which a cooling fluid is passed.

Similar to heating plate 40, cooling plate 80 includes a pattern of grooves 88 which are connectable to a source of vacuum. When activated, the vacuum will pull the wafer into close contact with the surface of plate 80 to maximize heat flow from the wafer to the cooling plate. Unlike heating plate 40, cooling plate 80 includes a slot 90 configured to receive the end of robotic arm 20. The slot allows the arm to move into the plate in coplanar fashion so that there is no need to employ the lift pin structure used in the heating station. A similar slot is not provided in the heating plate since such a slot would create unacceptable thermal variation in the heating of a wafer.

It should be noted that in the preferred embodiment, the heating and cooling stations are spatially separate and thermally isolated from each other but are mounted within the same external housing. In principle, the two chambers could be physically separated, however it is believed the preferred embodiment is more efficient since the two chambers are close together minimizing wafer transfer time. In addition, both chambers can share the same cooling water. In the illustrated embodiment, the cooling water is first pushed through the low heat duty of the cooling chamber followed by the high heat duty of the heating chamber.

In one important aspect of the subject invention, the entire cleaning module and its operating cycle are under the control of a computer processor. These control functions include both the basic operation of the heating and cooling chambers and, more importantly, control of the interaction between the heating and cooling cycles, wafer transfer times and subsequent measurement process. Accurate control of the system with one or more processors leads to more repeatable results. Under this approach, each wafer to be measured will be subjected to similar heating and cooling cycles. In addition, the time period between the cooling cycle and the beginning of the measurement cycle can be made the same for each wafer.

Figure 7:
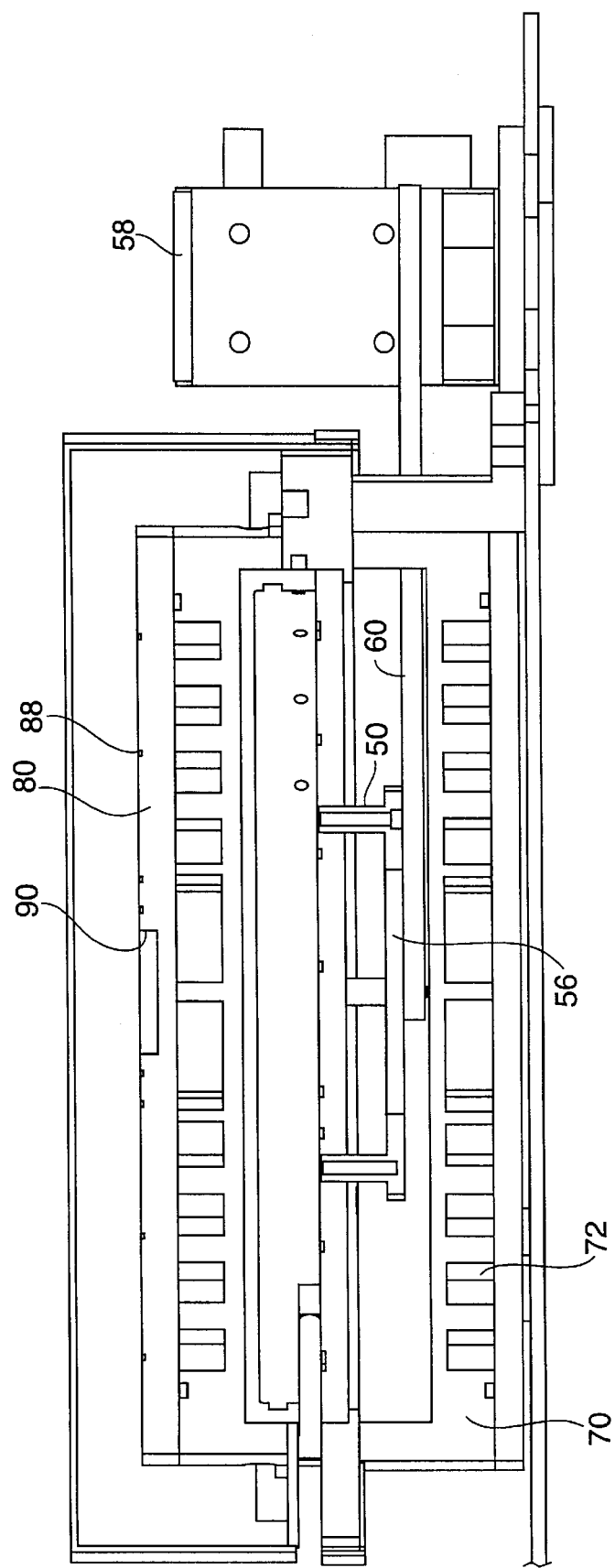
FIG. 7 is a cross-sectional view similar to FIG. 5 showing the lift pins in the lower or retracted position.

Having described the basic elements of the cleaning module 10 of the subject invention, a typical operating cycle will now be described. In use, a cassette holding a plurality of wafers will be placed on the cassette station 18. Robotic arm 20 will pull the first of the wafers out of the cassette and load it through opening 32 into the heating station 30. The wafer will be loaded onto the upper surface of pins 50. The robotic arm will then drop down away from the wafer and be retracted from the heating station. A vacuum will be applied to the grooves 46 and then pins 40 will retract from the upper wafer load position as shown in FIG. 6 to the lower wafer heating position as shown in FIG. 7.

Preferably, the heater element will already be elevated to the desired temperature. The desired temperature will vary based on the type of sample and nature of contaminant. The temperature should be high enough to drive off the contaminants but low enough so that the electrical devices on the wafer will not be damaged. In some initial experiments, it has been found that a temperature of 325 degrees C can be used. Various sensors are provided within the chamber to monitor its temperature. In the event that the temperature rises to an unacceptable level, the sensors can signal the processor to shut down the heating station before the wafer is damaged.

Because the wafer is in close contact with the heating plate, the wafer will reach the temperature of the plate in just a few seconds. The wafer will be allowed to remain on the heated plate for a predetermined time period. In practice, it has been found that a period of about 30 seconds is sufficient to drive off the contaminant layer. Note that since the wafer is heated to the desired temperature quickly (as compared to other approaches such as with radiant or microwave heating), the total heating time can be minimized, increasing throughput.

Once the predetermined time period has elapsed, the vacuum is turned off and the wafer will be raised off of the plate by pins 50 and removed from the heating station by robotic arm 20. The wafer will immediately be placed into the cooling station through opening 38 by robotic arm 20. Preferably, the vacuum is activated before the wafer is loaded on plate 80 so the wafer will be grabbed by the plate and not slide around. As noted above, the robotic arm will be received in slot 90 of plate 80 allowing the vacuum to grab the wafer. Once the wafer is grabbed by the vacuum, the robotic arm can be removed.

As noted above, plate 80 is water-cooled. In practice, it has been found that the wafer needs to remain on the plate 80 for only about 10 seconds in order to lower the temperature of the wafer to the ambient temperature Once the wafer has reached room temperature, it is removed from the cooling station by the robotic arm. Preferably, the wafer is loaded into the metrology tool very soon after the cooling cycle has been completed. As noted above, the contaminant layer begins to regrow on the wafer immediately after the heating cycle has been completed. Therefore the time period between the end of the heating cycle and the beginning of the cooling cycle, as well as the end of the cooling cycle and the beginning of the measurement cycle, should be minimized.

In accordance with the subject invention, the processor will control the processing of each of the subsequent wafers in the same manner as the first wafer. The time at which the next wafer is placed into the heating chamber will depend upon the length of the measurement cycle. For example, if the measurement cycle is quite long, the processor will wait until near the end of the measurement cycle before beginning to load the next wafer into the heating chamber. Conversely, if the measurement cycle is quite short, the processor would able to begin the heating cycle near the beginning of the measurement cycle.

Figure 8:
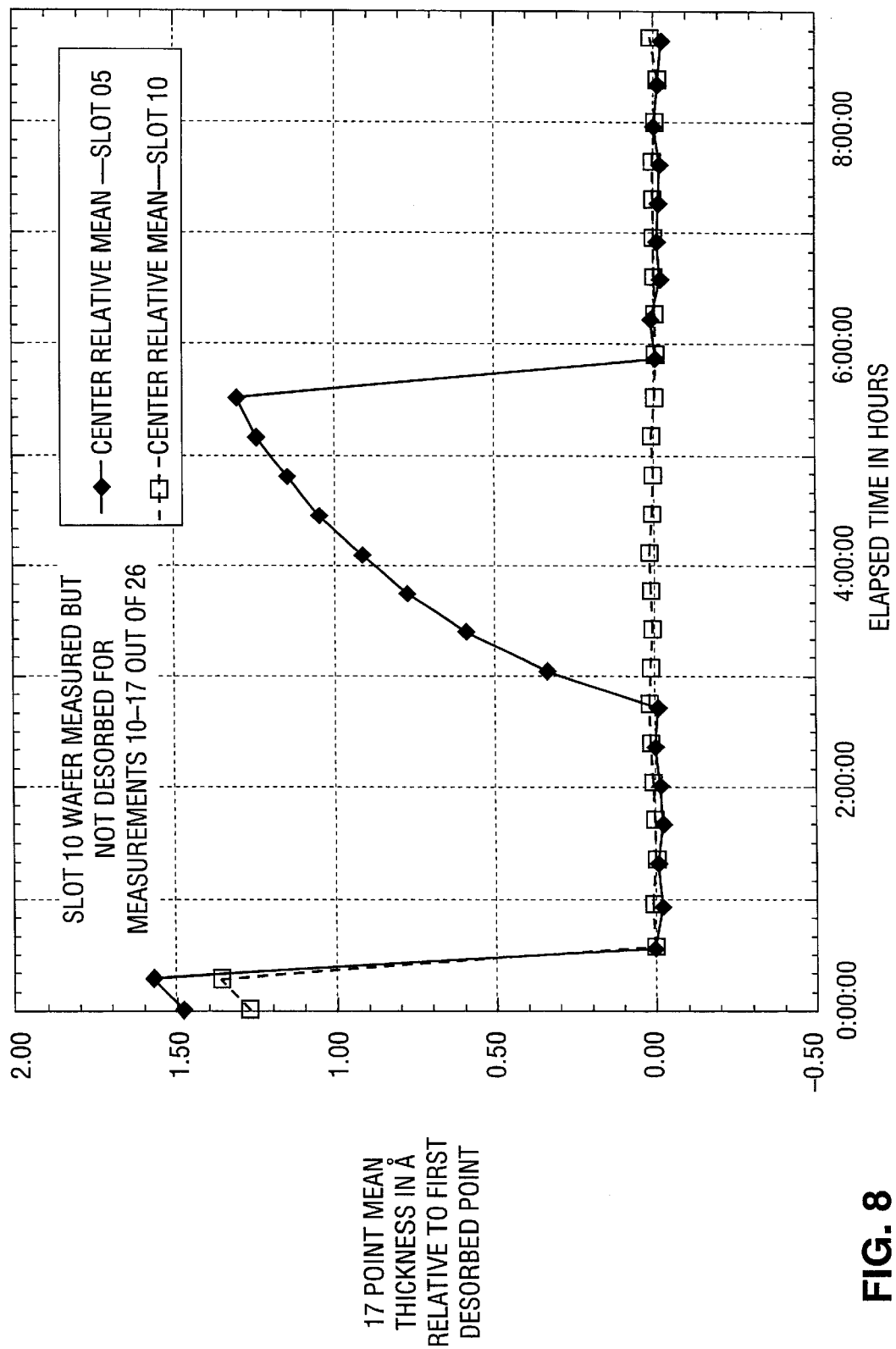
FIG. 8 is a graph illustrating thickness measurements and including a comparison between a wafer which has been subjected to the cleaning process throughout repeated measurements and another wafer where some measurements are taken without subjecting the wafer to a cleaning process.

FIG. 8 is a graph illustrating multiple measurements over time of two wafers. Both wafers were pre-measured two times at the start of the experiment. Each wafer was then re-measured every twenty minutes. The wafer from slot 10 (open boxes in graph) was subjected to repeated heating and cooling cycles before every measurement. As can be seen, the layer thickness did not vary significantly over all the subsequent measurement cycles. The wafer from slot 5 (closed boxes in graph) was subjected to cleaning cycles before each of the first seven measurements. This wafer was then measured eight more times without being subjected to any cleaning cycles. As can be seen, the thickness of the contaminant layer increased between each of the measurements where the wafer was not subjected to pre-cleaning. In fact, the thickness of the contaminant layer increased by about 1.3 Å over a period of less than three hours.

The wafer in slot 5 was then subjected to cleaning cycles before each of the remaining measurements. As can be seen, the cleaning cycles immediately reduced the thickness of contaminant layer back to the original minimal levels. This experiment demonstrates that all real-time film growth from the wafer can be removed in a single pass through the cleaning cycle. The thickness measurements in FIG. 8 are mean values obtained at 17 coordinates distributed across the wafer to achieve a meaningful sample of the representative oxide layer thickness value.

While the subject invention has been described with reference to a preferred embodiment, various changes and modifications could be made therein, by one skilled in the art, without varying from the scope and spirit of the subject invention as defined by the appended claims.

What is claimed:

1. A method of preparing semiconductor wafers for measurement in a metrology tool comprising the steps of:
   a) heating the wafer by conduction in a heating chamber for a predetermined time period to remove contaminants from the wafer surface;
   b) cooling the wafer by conduction in a cooling chamber separate from the heating chamber for a predetermined time; and
   c) measuring characteristics of the wafer with the metrology tool a predetermined time after the cooling step is completed.

2. A method as recited in claim 1, wherein steps (a) (b) and (c) are repeated for a plurality of wafers.

3. A method of preparing semiconductor wafers for measurement in a metrology tool comprising the steps of:
   a) loading a wafer onto a planar heater element located in a heating chamber;
   b) heating the wafer by conduction for a predetermined amount of time to remove contaminants from the wafer surface;
   c) removing the wafer from the heating chamber;
   d) loading the wafer onto a planar cooling element located in a cooling chamber thermally isolated from the heating chamber;
   e) cooling the wafer for a predetermined amount of time;
   f) removing the wafer from the cooling chamber and loading the wafer in the metrology tool;
   g) measuring characteristics of the wafer with the metrology tool.

4. A method as recited in claim 3, wherein steps (a) through (g) are repeated for a plurality of wafers.

5. A method as recited in claim 4, wherein the predetermined heating time is the same for the plurality of wafers.

6. A method as recited in claim 4, wherein the predetermined cooling time is the same for the plurality of wafers.

7. A method as recited in claim 4, wherein the time between the end of cooling step and the beginning of the measurement step is the same for the plurality of wafers.

8. A method as recited in claim 4, wherein the time between the end of the heating step and the beginning of the cooling step is the same for the plurality of wafers.

9. A method as recited in claim 4, wherein:
   the predetermined heating time is the same for the plurality of wafers;
   the predetermined cooling time is the same for the plurality of wafers;
   the time between the end of the heating step and the beginning of the cooling step is the same for the plurality of wafer; and
   the time between the end of cooling step and the beginning of the measurement step is the same for the plurality of wafers.

10. A method of preparing semiconductor wafers for measurement in a metrology tool comprising the steps of:
    a) heating the wafer in a heating chamber to remove contaminants from the wafer surface; and
    b) cooling the wafer in a separate cooling chamber thermally isolated from the heating chamber.

11. A method as recited in claim 10 further including the step of measuring characteristics of the wafer with the metrology tool after the cooling step is completed.

* * * * *